United States Patent
King et al.

(10) Patent No.: US 10,925,131 B2
(45) Date of Patent: Feb. 16, 2021

(54) PREDICTIVE LIGHTING CONTROL USING LOAD CURRENT SLEW RATE FOR POWER SWITCHING

(71) Applicant: Control4 Corporation, Salt Lake City, UT (US)

(72) Inventors: Sidney Lyle King, Draper, UT (US); Joseph M. Doubek, Salt Lake City, UT (US); Gregory Scott Smith, Woods Cross, UT (US); Robert Don Bruhn, Jr., West Jordan, UT (US)

(73) Assignee: WirePath Home Systems, LLC, Salt Lake City, UT (US)

( * ) Notice: Subject to any disclaimer, the term of this patent is extended or adjusted under 35 U.S.C. 154(b) by 0 days.

(21) Appl. No.: 16/655,990

(22) Filed: Oct. 17, 2019

(65) Prior Publication Data

US 2020/0128638 A1 Apr. 23, 2020

Related U.S. Application Data

(60) Provisional application No. 62/748,191, filed on Oct. 19, 2018.

(51) Int. Cl.
*H05B 45/14* (2020.01)
*G01R 19/165* (2006.01)
*H02M 1/00* (2006.01)

(52) U.S. Cl.
CPC ....... *H05B 45/14* (2020.01); *G01R 19/16571* (2013.01); *H02M 2001/0009* (2013.01)

(58) Field of Classification Search
CPC ............. H05B 45/14; G01R 19/16571; H02M 2001/0009
See application file for complete search history.

(56) References Cited

U.S. PATENT DOCUMENTS

| | | | | |
|---|---|---|---|---|
| 5,903,139 A * | 5/1999 | Kompelien | ........... | H02M 5/293 323/282 |
| 2009/0323375 A1* | 12/2009 | Galvano | ............... | H02M 3/156 363/21.06 |
| 2011/0018516 A1* | 1/2011 | Notman | .............. | H02M 3/1588 323/284 |
| 2012/0242235 A1* | 9/2012 | Naruo | .................... | H05B 45/37 315/186 |

(Continued)

FOREIGN PATENT DOCUMENTS

WO WO-2015062950 A1 * 5/2015 ............ H02M 1/083

OTHER PUBLICATIONS

Eileen Patton, EIC 2800 Search Report, Mar. 19, 2020, Scientific and Technical Information Center (Year: 2020).*

(Continued)

*Primary Examiner* — Raymond R Chai
(74) *Attorney, Agent, or Firm* — Austin Rapp

(57) ABSTRACT

An electronic device is described. The electronic device includes current measuring circuitry configured to measure load current to produce a load current measurement. The electronic device also includes a processor coupled to the current measuring circuitry. The processor is configured to calculate an estimated load current slope based on the load current measurement and to determine a predicted zero-cross point based on the estimated load current slope to minimize damaging voltage spike creation.

18 Claims, 6 Drawing Sheets

(56) References Cited

U.S. PATENT DOCUMENTS

| | | | | |
|---|---|---|---|---|
| 2014/0211864 A1* | 7/2014 | Braunshtein | ........... | H04B 3/548 |
| | | | | 375/257 |
| 2016/0035524 A1* | 2/2016 | Zulim | .................. | H01H 47/325 |
| | | | | 361/211 |
| 2018/0217658 A1* | 8/2018 | Bruhn, Jr. | ............ | H03K 5/1536 |
| 2019/0326815 A1* | 10/2019 | Yazdi | .................... | H02M 3/157 |

OTHER PUBLICATIONS

"Moving average", Wikipedia, retrieved from the Internet, https://en.wikipedia.org/wiki/Moving_average Sep. 21, 2012.

\* cited by examiner under a patent heading>

PREDICTIVE LIGHTING CONTROL USING LOAD CURRENT SLEW RATE FOR POWER SWITCHING

RELATED APPLICATIONS

This application is related to and claims priority from U.S. Provisional Patent Application Ser. No. 62/748,191, filed Oct. 19, 2018, for "PREDICTIVE LIGHTING CONTROL USING CURRENT SLEW RATE FOR POWER SWITCHING," with first named inventor Sidney Lyle King.

TECHNICAL FIELD

The present disclosure relates generally to electronic devices. More specifically, the present disclosure relates to systems and methods for predictive lighting control using load current slew rate for power switching.

BACKGROUND

In recent years, the price of electronic devices has decreased dramatically. In addition, the size of electronic devices has continued to decrease. Further, electronic devices continue to increase in capability and convenience.

Decreasing prices and increasing capabilities of electronic devices has permitted modern devices to be conveniently used in homes and businesses. Many homes and businesses include multiple electronic devices to assist in everyday tasks. For example, electronic devices may be used for convenience and/or entertainment.

While some electronic devices may provide convenience and entertainment, many also require control. Moreover, these electronic devices consume electrical power. Safety is also a concern with some electronic devices. As can be observed from this discussion, improvements to electronic device ease of use, efficiency and/or safety may be beneficial.

DETAILED DESCRIPTION

Figure 1:
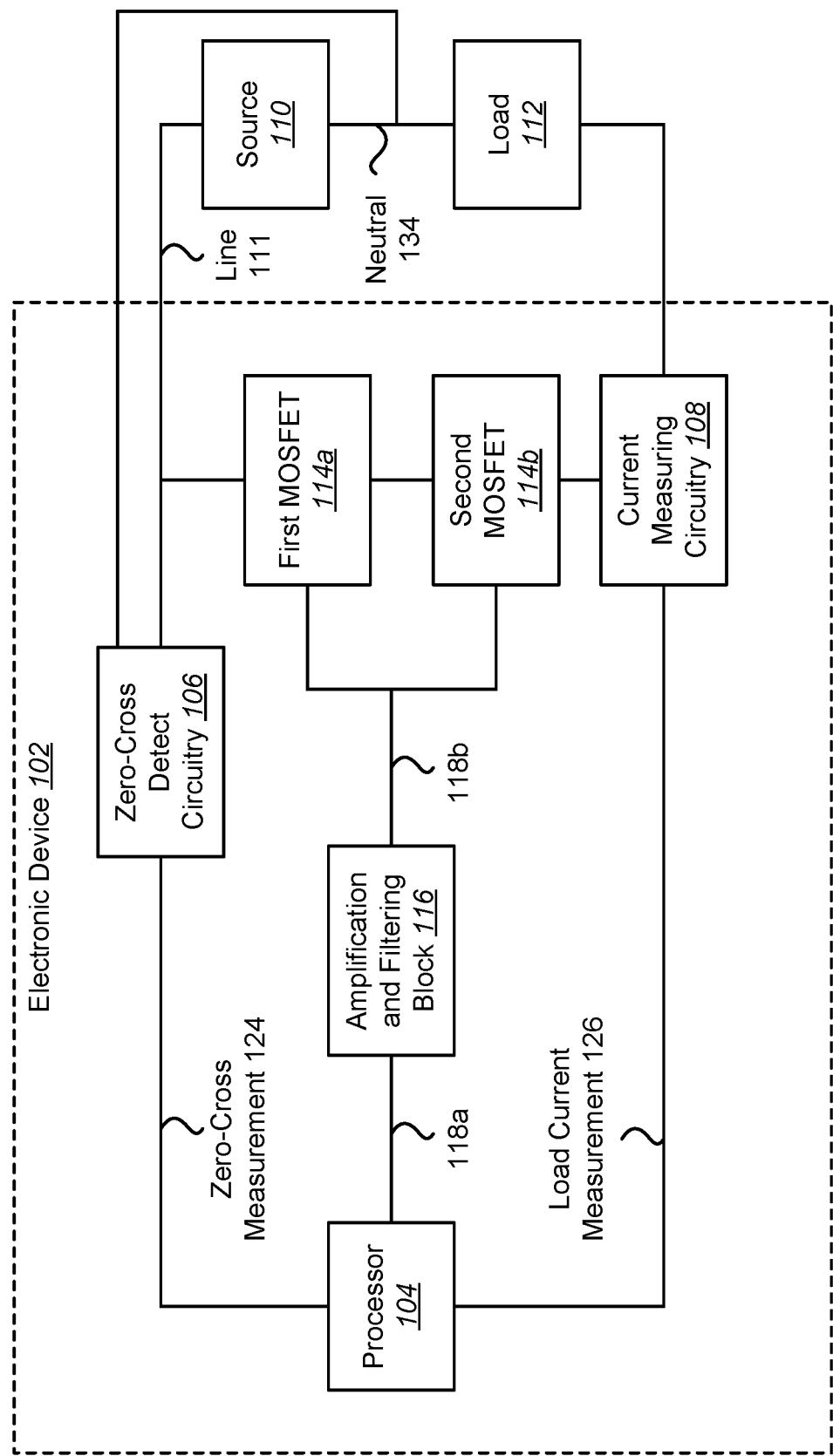
FIG. 1 is a block diagram illustrating one configuration of an electronic device for predictive lighting control using load current slew rate for power switching.

An electronic device is described. The electronic device includes current measuring circuitry configured to measure load current to produce a load current measurement. The electronic device also includes a processor coupled to the current measuring circuitry. The processor is configured to calculate an estimated load current slope based on the load current measurement and to determine a predicted zero-cross point based on the estimated load current slope to minimize damaging voltage spike creation.

The processor may calculate a rolling average of the load current for a current sample point. The processor may calculate the rolling average using at least ten sample points. The processor may store the rolling average in an average value array. The average value array may include rolling averages for a number of sample points.

The processor may determine an average load current difference between the rolling average for the current sample point and a rolling average for an earlier sample point. The processor may divide the average load current difference by a time interval between the current sample point and the earlier sample point to calculate the estimated load current slope.

The processor may determine the predicted zero-cross point by adding the rolling average of the load current for the current sample point to the estimated load current slope multiplied by a look-ahead value. The look-ahead value may include a time interval to compensate for switching delays. The processor may determine that the predicted zero-cross point crosses an X-axis when the predicted zero-cross point changes sign.

The processor may cause at least one switch to be turned off at the predicted zero-cross point. The processor may cause the at least one switch to be turned off when the predicted zero-cross point changes sign. The at least one switch may include a first metal-oxide-semiconductor field-effect transistor (MOSFET).

A method is also described. The method includes measuring load current to produce a load current measurement. The method also includes calculating an estimated load current slope based on the load current measurement. The method further includes determining a predicted zero-cross point based on the estimated load current slope to minimize damaging voltage spike creation.

A non-transitory computer-readable medium is also described. The computer-readable medium includes executable instructions for measuring load current to produce a load current measurement. The computer-readable medium also includes executable instructions for calculating an estimated load current slope based on the load current measurement. The computer-readable medium further includes executable instructions for determining a predicted zero-cross point based on the estimated load current slope to minimize damaging voltage spike creation.

Some configurations of the systems and methods disclosed herein may relate to controlling MOSFETs. MOSFETs may be used to dim lights in a configuration where the MOSFETs either block or allow voltage and current to pass from the power lines to the lighting loads.

When a dimmer is connected to a magnetic load, the turn-off timing becomes important to prevent voltage and/or current spikes (transients). Current will lag voltage when driving magnetic loads. It is desirable to turn off the load precisely when there is no current flowing. Large undesired voltage transients may be created if the load is turned off too early or late. These transients may easily destroy or weaken electronic components in the dimmer leading to early failure of the dimming module.

In certain configurations, less-than-real-time historical timing measurements have been used to analyze and calculate the time to turn off the load. A phase lag number such as 275 microseconds (µs) would be used to determine the time when the load should be turned off after sensing voltage zero-cross. This typically can control the load within about +/−100 µs of the actual current zero-cross event. Another method requires a much more active method to sense and control the circuit when current reaches a zero value +/−a threshold level. The load is then turned off when the current reaches zero. In some examples, this may be done at a 20 μs rate. Unfortunately, by the time the load is turned off, the current may have already passed the current zero point by 40 μs to 80 μs or more due to MOSFET switching latency. With the current MOSFET drive channel, either of these methods may result in voltage spikes over 600V, which may damage certain electronic parts.

The present systems and methods predict when the current will cross the zero point at some time in the future. This will allow time to command the MOSFETs to turn off at the time the current is at a zero value. Since the AC waveform is a periodic sine wave, it can be broken up into many smaller segments that approximate straight lines. If the system then calculates the slope for these straight lines, it can use this slope to calculate the X-intercept or zero-cross point. By taking the difference in the current measurements with respect to time, the system is able to calculate the slope of the current waveform at any given point. It should be noted that the slope of the load current may also be referred to as the slew rate. In other words, the slew rate is the amount of load current that changes within a specific time interval.

The system can then set a look-ahead value to predict that zero-cross event, as an example, to 80 μs to 100 μs in the future. This timing can be adjusted to just about any value depending on switching delays. The MOSFET devices can then be commanded to be turned off. This alone should allow a control tolerance within +−20 μs. If needed, the system may interpolate this predicted zero-cross event to provide an even tighter control of timing with higher resolution than 20 μs.

As used herein, the term "couple" and other variations thereof (e.g., "coupled," "coupling," etc.) may mean that one element is connected to another element directly or indirectly. For example, if a first element is coupled to a second element, the first element may be connected directly to the second element (without any intervening element, for example) or may be connected to the second element through one or more other elements. Lines in one or more of the Figures (e.g., in the block diagrams) may indicate couplings.

Various configurations are now described with reference to the figures, where like reference numbers may indicate functionally similar elements. The systems and methods as generally described and illustrated in the figures herein could be arranged and designed in a wide variety of different configurations. Thus, the following more detailed description of several configurations, as represented in the Figures, is not intended to limit scope, as claimed, but is merely representative of the systems and methods. As used herein, the term "plurality" may indicate two or more. For example, a plurality of components may refer to two or more components.

FIG. 1 is a block diagram illustrating one configuration of an electronic device 102 for predictive lighting control using load current slew rate for power switching. The electronic device 102 may include a processor 104 (e.g., a central processing unit (CPU)), current measuring circuitry 108, zero-cross detect circuitry 106, an amplification and filtering block 116, a first MOSFET 114*a* and a second MOSFET 114*b*. Collectively, the first MOSFET 114*a* and the second MOSFET 114*b* may be referred to as MOSFETs 114. The processor 104 may be coupled to the current measuring circuitry 108, to the amplification and filtering block 116 and/or to the MOSFETs 114 (via the amplification and filtering block 116, for instance).

Examples of electronic devices 102 include electronic circuits, integrated circuits, circuits with discrete components (e.g., resistors, capacitors, transistors, MOSFETs, etc.), computers, and/or devices that include one or more processors, memory cells, latches, logic gates, etc. For instance, the electronic device 102 may be a switch and/or a dimmer that includes discrete components and a processor 104 (e.g., microprocessor) that may be used to control switching circuitry. The processor 104 may include and/or access software in memory and/or firmware. For example, the electronic device 102 may include memory. The memory may be included on-board the processor or may be separate from the processor 104. The memory may store instructions and/or data (e.g., samples, voltage samples, and/or current samples, etc.). Additionally, or alternatively, the memory or a separate memory may store firmware. In some configurations, the electronic device 102 may be a semiconductor-based dimmer (e.g., a MOSFET-based dimmer). In some configurations, the electronic device 102 may be housed within a wall box. In some configurations, the electronic device 102 may be housed within a panel (e.g., lighting panel).

The electronic device 102 may be coupled to a source 110 (e.g., an alternating current (AC) voltage source) and/or to a load 112. For example, the electronic device 102 may be coupled to the source 110 on a line 111 coupling (e.g., line 111 terminal). For example, an AC voltage may be provided to the electronic device 102 through the feed line 111. In some configurations, the source 110 may output an AC voltage (e.g., 240 volts (V), 120 V, etc.). The AC voltage may be provided to the electronic device 102 between the line 111 (e.g., "hot") and neutral 134. The voltage between the line 111 and neutral 134 may be referred to as line voltage.

The electronic device 102 may be coupled to a load 112. For example, the MOSFETs 114 of the electronic device 102 may be coupled to the load 112. With alternating current, two MOSFETs 114 may be employed in a configuration where a first MOSFET 114*a* controls the current to the load 112 and the second MOSFET 114*b* is used to control the current coming from the load 112. The load 112 may also be coupled to the electronic device 102 at neutral 134 (e.g., a neutral line). The MOSFETs 114 may activate or deactivate the load 112.

Some load types may include inductive, capacitive, and resistive load types. Inductive load types may have a magnetic inductor of some sort. One example of an inductive load is a magnetic transformer for low voltage (e.g., magnetic low voltage (MLV)) lighting. Inductive load types may have a waveform characteristic in which the phase of the current lags (e.g., comes after) the voltage waveform.

Capacitive load types may have a detectable amount of capacitance. Examples of capacitive loads are dimmable LED's, dimmable fluorescent lights and electronic low voltage (ELV) lighting. Capacitive load types may have a waveform characteristic in which the phase of the current leads (e.g., comes before) the voltage waveform. However, some capacitive loads may exhibit a different waveform characteristic due to a power supply. For example, some capacitive loads may have a waveform characteristic in which the phase of the current lags a voltage waveform (e.g., line voltage waveform) due to an activation delay resulting from a power supply.

Resistive load types may exhibit current and voltage waveforms in phase with each other. For example, there may be no significant (e.g., discernible) lead or lag between current and voltage in resistive load types. Examples of resistive loads include incandescent and halogen lights.

The electronic device 102 (e.g., processor 104 and/or MOSFETs 114) may control the amount of power delivered to the load 112. In some configurations (e.g., switch, dimmer, etc.), the MOSFETs 114 may turn on (e.g., activate) the power or turn off (e.g., deactivate) the power to the load 112. Additionally or alternatively, the electronic device 102 (e.g., processor 104 and/or MOSFETs 114) may adjust the amount of power that is delivered to the load 112 (e.g., enable, disable, adjust duty cycle, cut phase, increase phase, etc.).

As observed by this discussion, not all lighting loads are alike. Standard incandescent lamps connected directly to a switch or dimmer can be switched on and off with little, if any, sensing or control. These resistive loads behave very similarly to a resistor connected in a circuit with no electrical reactive behavior. This means that whether a resistive load is connected to an AC or DC power supply, the circuit behaves the same. LED-type lighting is more complicated than a resistor but typically behaves like a connected capacitor, which stores a bit of energy. Connecting either of these load types to a dimmer or switch creates little to no adverse waveform distortion.

However, a more finicky type of lamp is connected to a magnetic transformer and then to the dimmer. This configuration may be referred to as magnetic low voltage (MLV) lighting. The magnetics of this lighting technology pose some challenges with possible voltage transients as a result of improper drive. The more tightly the control and turn-off switching time is correlated with respect to current, the lower the voltage transients.

In an AC circuit, a transformer manifests the lagging relationship current has with voltage. This relationship may be described in terms of lag, either in terms of degrees or, in the case of this disclosure, in time (e.g., microseconds (μs)). Because AC power follows a gently changing sine wave, current and voltage are truly at equilibrium, with no transients in a well-designed transformer system. With an AC waveform, the voltage and current each take turns at reaching zero amps or volts. In a resistive system, they both reach zero at the same time. In an inductive circuit (e.g., MLV circuit), voltage reaches zero first and then current will follow or lag by a certain number of microseconds. If the voltage connection to the dimmer switch (e.g., transformer or MOSFET 114) is removed while there is still current flowing (e.g., the load current is not at zero) a large voltage transient (e.g., over 1 kV) may be generated. This large voltage transient can damage even the most robust semiconductors.

In some implementations, an adaptive phase dimmer may use MOSFETs 114 to switch voltage quickly. The MOSFETs 114 work very well to turn loads on and off. However, the MOSFETs 114 can be damaged if the switching transients exceed 600V. A switching error of 100 μs, for example, may result in a voltage spike of over 700V. The higher and wider the voltage spike, the more likely the MOSFET 114 will fail. Semiconductor protection components (e.g., transient voltage suppression or TVS) may be used to mitigate these transients on the MOSFETs 114. However, these TVS devices subjected to repeated 600V or more spikes will eventually fail, causing the MOSFET 114 to fail and render the channel unusable.

The present systems and methods predict when the load current will cross the zero point at some time in the future. This will allow time to command the MOSFETs 114 to turn off at the time the load current is at a zero value.

In some implementations, the AC waveform of the load current is a periodic sine wave. The AC waveform may be expressed with a Y-axis representing the value of load current and the X-axis may represent time. As used herein, a zero-cross point is the point in time that the load current crosses the X-axis.

The electronic device 102 may include current measuring circuitry 108. The current measuring circuitry 108 may measure the load current (i.e., the current passed to the load 112) to produce a load current measurement 126. The current measuring circuitry 108 may provide the load current measurement 126 to the processor 104. The waveform of the load current may be captured by taking multiple measurements (also referred to as samples) of the load current at different times (referred to as sample points). In some examples, the sampling rate may be 20 μs, although other sampling rates may be used. The electronic device 102 may store the raw load current measurement 126 for a number of sampling points based on a configured sampling range value (n). In an example, the sampling range value (n) may be 10. In this case, the electronic device 102 may store the raw load current measurements 126 for 10 sequential load current samples.

The processor 104 may calculate an estimated load current slope based on the load current measurement 126. The waveform of the load current can be broken up into many smaller segments that approximate straight lines. If the processor 104 calculates the slope for a straight-line approximation of the current waveform, the processor 104 may use this slope to calculate the X-intercept (also referred to as the zero-cross point) for the load current. It should be noted that the sampling point range value (n) may be selected such that the sample points are approximately linear over the sampling point range without being so small that noise may dominate the results. For example, it should be noted that because a relatively narrow section of the waveform is being used (e.g., approximately 200 μs (10 samples times 20 μs)), the waveform segment and the mathematical model both describe a straight line.

In some examples, the processor 104 may calculate a rolling average of the load current for a current sample point. A rolling average (also referred to as a moving average) of the load current may be used to diminish the impact of noise on any one load current measurement 126. To determine the rolling average load current for the current sample point, the processor 104 may determine the average load current using the raw load current measurement 126 of the current sample point and a number of earlier load current measurements 126. In some approaches, a 10-point spacing may be used with respect to a sampling time (first derivative) such that the system is able to calculate the slope. In an example, the rolling average for a given sample point may be calculated according to Equation (1).

$$AvgAmps[n] = \frac{Amps[n] + Amps[n-1] + \ldots + Amps[1]}{n} \quad (1)$$

In Equation (1), AvgAmps[n] is the rolling average load current for a current sample point and Amps[n] is raw load current measurement 126 for the current sample point, Amps[n−1] is the raw load current measurement 126 for the prior sample point and so forth until Amps[1], which is the last raw load current measurement 126 in the sampling range. In the case that n is 10, the rolling average for the current sampling point is the average of the current load current measurement 126 and the prior nine load current measurements 126.

The processor 104 may store the rolling average in a rolling average value array. The rolling average value array may include n rolling averages for the current and previous sample points. For example, the rolling average value array may include the rolling average for the current sample point and the n–1 prior rolling averages. An example of a rolling average value array is described in connection with FIG. 5.

In some implementations, the processor 104 may calculate the estimated load current slope by taking the difference in the current measurements with respect to time. The processor 104 may calculate the slope of the load current waveform at any given sampling point. The processor 104 may determine an average load current difference between the rolling average for the current sample point and the rolling average for an earlier sample point. The processor 104 may then divide the average load current difference by a time interval between the current sample point and the earlier sample point. In an implementation, the estimated load current slope (Slope) may be determined according to Equation (2).

$$\text{Slope} = \frac{AvgAmps[n] - AvgAmps[1]}{TimeInterval} \quad (2)$$

In Equation (2), AvgAmps[n] is the rolling average for the current sample point and AvgAmps[1] is the last (i.e., earliest) rolling average of the sampling point range. In Equation (2), TimeInterval is the time interval between the current sample point and the last sample point. In the case where the sampling point range value (n) is 10, the TimeInterval may be the time between the current sample point (i.e., the most recently stored value in the rolling average value array) and the 10th sampling point. If a rolling average is used (using 10 points in one example configuration) on these calculated slopes, the system will have a smoothed line to use to predict the X-intercept (i.e., the current zero-cross).

The processor 104 may determine a predicted zero-cross point based on the estimated load current slope to minimize damaging voltage spike creation. For example, the processor 104 may add the most recent rolling average load current measurement AvgAmps[n] to the load current slope multiplied by a look-ahead value to determine an estimated future zero-cross event. This may be expressed according to Equation (3).

$$\text{ZeroCross} = (AvgAmps[n]) + (\text{Slope} \times \text{LookAheadValue}) \quad (3)$$

In Equation (3), ZeroCross is the predicted zero-cross point where the load current is predicted to be zero. Slope may be determined according to Equation (2). The LookAheadValue is the look-ahead value. In some examples, the look-ahead value may be adjusted to compensate for a time interval that is based on switching delays. For example, the look-ahead value may be a fixed value that is configured to account for signal propagation delays, sampling delays, processing delays, switching delays of MOSFETs 114, etc. In an example to predict that zero-cross event, the look-ahead value may be set to 80 μs or 100 μs in the future. It should be noted that this timing (i.e., the look-ahead value) can be adjusted to just about any value depending on switching delays.

In some examples, the processor 104 may determine that the predicted zero-cross point crosses the X-axis when the predicted zero-cross point changes sign. For example, when the value of the ZeroCross switches from positive to negative (or from negative to positive), the processor 104 may determine that the zero-cross point has been reached. In some implementations, the processor 104 may interpolate this predicted zero-cross event to provide even tighter control of timing with higher resolution (e.g., greater than 20 μs).

This process may be repeated to detect the zero-cross point. By doing this iteratively and continuously, the processor 104 may predict a number of points (e.g., the look-ahead value) into the future when the load current will cross the X-axis. This method alone should allow a control tolerance within +–20 μs.

The processor 104 may cause at least one switch (e.g., one or more of the MOSFETs 114) to be turned off at the predicted zero-cross point. For example, the processor 104 may cause the at least one switch to be turned off when the predicted zero-cross point changes sign. The processor 104 may generate a signal 118a instructing one or more of the MOSFETs 114 to turn off.

In an implementation, the processor 104 may output an analog voltage ramp signal 118a, which is amplified by the amplification and filtering block 116. The MOSFETs 114 may include a controlling gate input. A voltage ramp waveform 118b received at the controlling gate input may cause the MOSFETs 114 to transition from an off to an on state or from an on state to an off state.

In some implementations, the one or more MOSFETs 114 may be turned off for a period of time corresponding to an amount of dimming. For instance, for 20% dimming, the one or more MOSFETs 114 may be turned off for 20% of the AC waveform. For 50% dimming, the one or more MOSFETs 114 may be turned off for 50% of the AC waveform and so forth.

In some implementations, prediction of the zero-cross point may be based on the timing of peak detection. For example, the electronic device 102 may start the zero-cross prediction when detecting a peak in a voltage (e.g., line voltage or load voltage) or a peak in the load current. When the electronic device 102 detects a peak (e.g., voltage and/or current), the electronic device 102 may begin predicting the zero-cross point as described herein. Upon initiating the zero-cross prediction, the previously stored values of the load current measurements 126 and/or the rolling average value array may be reset.

In some implementations, the MOSFETs 114 may be turned on based on line voltage zero-cross. The zero-cross circuitry 106 may detect a line voltage zero cross (e.g., one or more zero cross times for the line voltage). For example, the zero-cross circuitry 106 may determine the time (e.g., position) where the line voltage crosses a zero point. In other words, the zero-cross circuitry 106 may determine the time when the value of the line voltage is zero. The time when the value of the line voltage is zero may be the line voltage zero cross. In some approaches, the zero-cross circuitry 106 may detect at time at which the line voltage switches from negative to positive or positive to negative. For example, the line voltage zero cross may be determined (e.g., estimated) as a time between positive and negative voltage samples (e.g., between a last positive voltage sample and a first negative voltage sample in a cycle or between a last negative voltage sample and a first positive voltage sample). One or more line voltage zero crossings (e.g., line voltage zero cross timings, time stamps, etc.) may be stored in memory in some implementations.

In some configurations, the one or more line voltage zero-crossings may be indicated to the processor 104. For example, the zero-cross circuitry 106 may send a zero-cross measurement signal 124 (e.g., a step signal, a bit, a code, etc.) to the processor 104 that indicates the timing for the one or more line voltage zero-crossings. The processor 104 may utilize the line voltage zero-cross(ings) to control the MOSFETs 114. For example, the processor 104 may control the state of the MOSFETs 114 (e.g., one or more states of one or more switches, MOSFETs, etc.) in order to coordinate the switch activation and/or deactivation with line voltage zero-cross(ings). Therefore, the activation of the MOSFETs 114 may be based on the line voltage zero-cross measurement 124 and the deactivation of the MOSFETs 114 may be based on the predicted zero-cross of the load current using the load current measurements 126.

In an implementation of the present systems and methods, one set of results provides the following. An oscilloscope was used to measure the voltage transients (spikes) for two different drive levels. In this one implementation, it also measured the spikes using the original simple current threshold detect method. The results are presented in Table-1.

TABLE 1

| 7.5 W LED Load Connected to a Laminated Iron Core Transformer at 120 V |  |
| --- | --- |
| 20% Dimming Level |  |
| Original Current Zero-cross Method: | 700 V Transient |
| New Slew Rate Method: | 108 V Transient |
| New method has a voltage spike that is 6.5 times lower. |  |
| 50% Dimming Level |  |
| Original Current Zero-cross Method: | 708 V Transient |
| New Slew Rate Method: | 252 V Transient |
| New method has a spike that is 2.8 times lower. |  |

As demonstrated by these results, the present systems and methods provide lower voltage spikes than certain other older current zero-cross methods.

In some configurations, the electronic device 102 may be a dimmer and/or may include a dimmer. For example, the MOSFETs may activate and/or deactivate the load (periodically and/or cyclically, for instance) in order to achieve a particular dimming level. This may be referred to as "phase-cut" dimming, where different amounts (e.g., time segments, portions, etc.) of load voltage may be cut (e.g., deactivated) in order to produce different dimming levels. When no portion of the load voltage is cut, the load may be driven in a fully activated state, where the full cycle of load voltage is provided. This may be referred to as a "full-on" (e.g., 100%) dimming level (e.g., a dimming level of no dimming). A range of cycle portions may be cut according to dimming level. For example, a half (e.g., 50%) dimming level may cut approximately half of the load voltage cycle. Other dimming levels (e.g., 0%, 25%, 33%, 75%, 90%, etc.) may similarly be achieved by controlling the MOSFETs 114 to cut corresponding portions from the load voltage cycle.

In some configurations, the electronic device 102 may be housed in a wall box or lighting panel. For example, the electronic device 102 may be configured to be contained within a wall box as an electrical device. A wall box (e.g., electrical box, outlet box, switch box, pattress, etc.) is the container for the body of an electrical device (e.g., light switch, power outlet, dimmer, etc.). While housed in the wall box, the face of the electrical device may be approximately flush with a wall. In general, the width of a wall box may be measured in "gangs," which indicates the number of electrical devices (e.g., light switches, power outlets, dimmers, etc.) that the wall box can hold. For example, a single-gang wall box may hold a single electrical device and a double-gang wall box may hold two electrical devices (side by side, for example). The depth of a wall box may be standard depth, shallow depth, or deep depth. In some configurations of the systems and methods disclosed herein, a wall box may be a single-gang standard depth wall box and a wall box device may be an electronic device 102 that may be held in a single-gang standard depth wall box. In one configuration, a European style wall box having a width of 86 millimeters, a height of 86 millimeters and a depth of 35 millimeters may be used. In another configuration, a United States style, single-gang, standard depth wall box may be used. It should be noted that other configurations of the systems and methods disclosed herein may not be housed in a wall box. For example, some configurations of the systems and methods disclosed herein may be implemented in lighting devices that are not housed in wall boxes. Additionally, or alternatively, a spacer may be utilized in some configurations that places a portion of the device (e.g., an electronic device 102) outside of a wall box.

A wall box dimmer is another example of an electronic device 102 with variable states that may be used to control a load 112. A wall box dimmer may variably adjust the amount of electrical power that is driven to the load 112 (e.g., by adjusting the root mean square (RMS) voltage, adjusting pulse-width modulation, adjusting duty cycle, adjusting a phase cut, etc.). For example, a wall box dimmer may provide 0% electrical power, 100% electrical power or some percentage in between. In one configuration, a wall box dimmer may use one or more semiconductors (e.g., MOSFETs, transistors, etc.) to control the load 112. A simple example of a wall box dimmer is a light dimmer that may turn on or off and variably control the brightness of a light. For example, the light dimmer may increase the brightness of the light by increasing the amount of electrical power driven to the light. Similarly, the light dimmer may decrease the brightness of the light by decreasing the amount of electrical power driven to the light. In some configurations, the wall box device may include switching and dimming capabilities.

It should be noted that one or more of the elements or components described in relation to FIG. 1 may be combined and/or divided in some configurations. For example, the MOSFETs 114, processor 104, amplification and filtering block 116, zero-cross detect circuitry 106, and/or current measuring circuitry 108 may be divided into smaller elements or components that perform a subset of the functions described herein. Additionally, or alternatively, one or more of the MOSFETs 114, processor 104, amplification and filtering block 116, zero-cross detect circuitry 106, and/or current measuring circuitry 108 may be combined.

Figure 2:
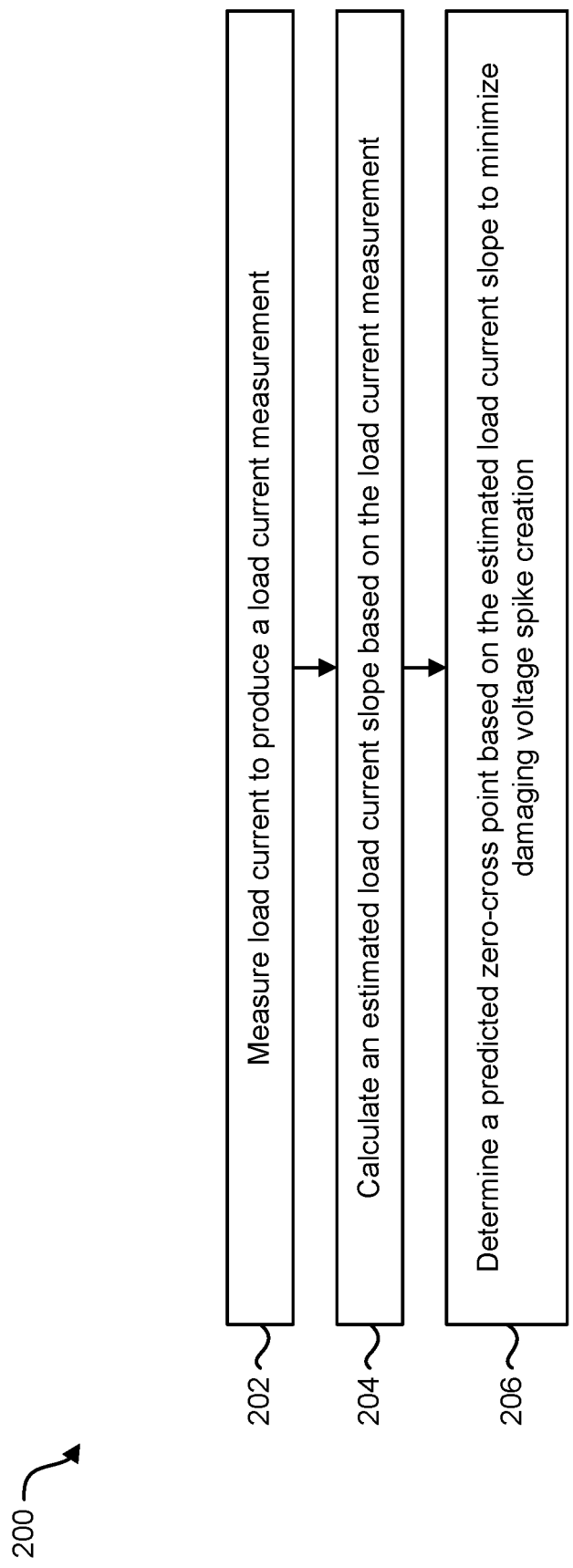
FIG. 2 is a flow diagram illustrating one configuration of a method for predictive lighting control using load current slew rate for power switching.

FIG. 2 is a flow diagram illustrating one configuration of a method 200 for predictive lighting control using load current slew rate for power switching. The method 200 may be performed by the electronic device 102 described in relation to FIG. 1.

The electronic device 102 may measure 202 the load current to produce a load current measurement 126. For example, the electronic device 102 may include current measuring circuitry 108. The current measuring circuitry 108 may measure 202 the load current (i.e., the current passed to the load 112) to produce a load current measurement 126.

The electronic device 102 may calculate 204 an estimated load current slope based on the load current measurement 126. For example, the electronic device 102 may calculate a rolling average of the load current for a current sample point. In some implementations, the electronic device 102 may calculate the rolling average using at least ten sample points. The electronic device 102 may store the rolling average in a rolling average value array. The rolling average value array may include rolling averages for a number of sample points (e.g., at least ten sample points). This may be accomplished according to Equation (1).

In an implementation, the electronic device 102 may calculate 204 the estimated load current slope (also referred to as the slew rate) by determining the average load current difference between the rolling average for the current sample point and a rolling average for an earlier sample point. The electronic device 102 may then divide the average load current difference by a time interval between the current sample point and the earlier sample point. The estimated load current slope may be determined according to Equation (2).

The electronic device 102 may determine 206 a predicted zero-cross point based on the estimated load current slope to minimize damaging voltage spike creation. For example, the electronic device 102 may add the most recent rolling average load current measurement (e.g., the rolling average load current measurement for the current sample) to the estimated load current slope multiplied by a look-ahead value. This may be accomplished according to Equation (3). In some implementations, the look-ahead value may be a time interval that is configured to account for switching delays.

In some approaches, the electronic device 102 may cause at least one switch to be turned off at the predicted zero-cross point. For example, the electronic device 102 may cause the at least one switch to be turned off when the predicted zero-cross point changes sign. The at least one switch may include a first metal-oxide-semiconductor field-effect transistor (MOSFET) 114a.

Figure 3:
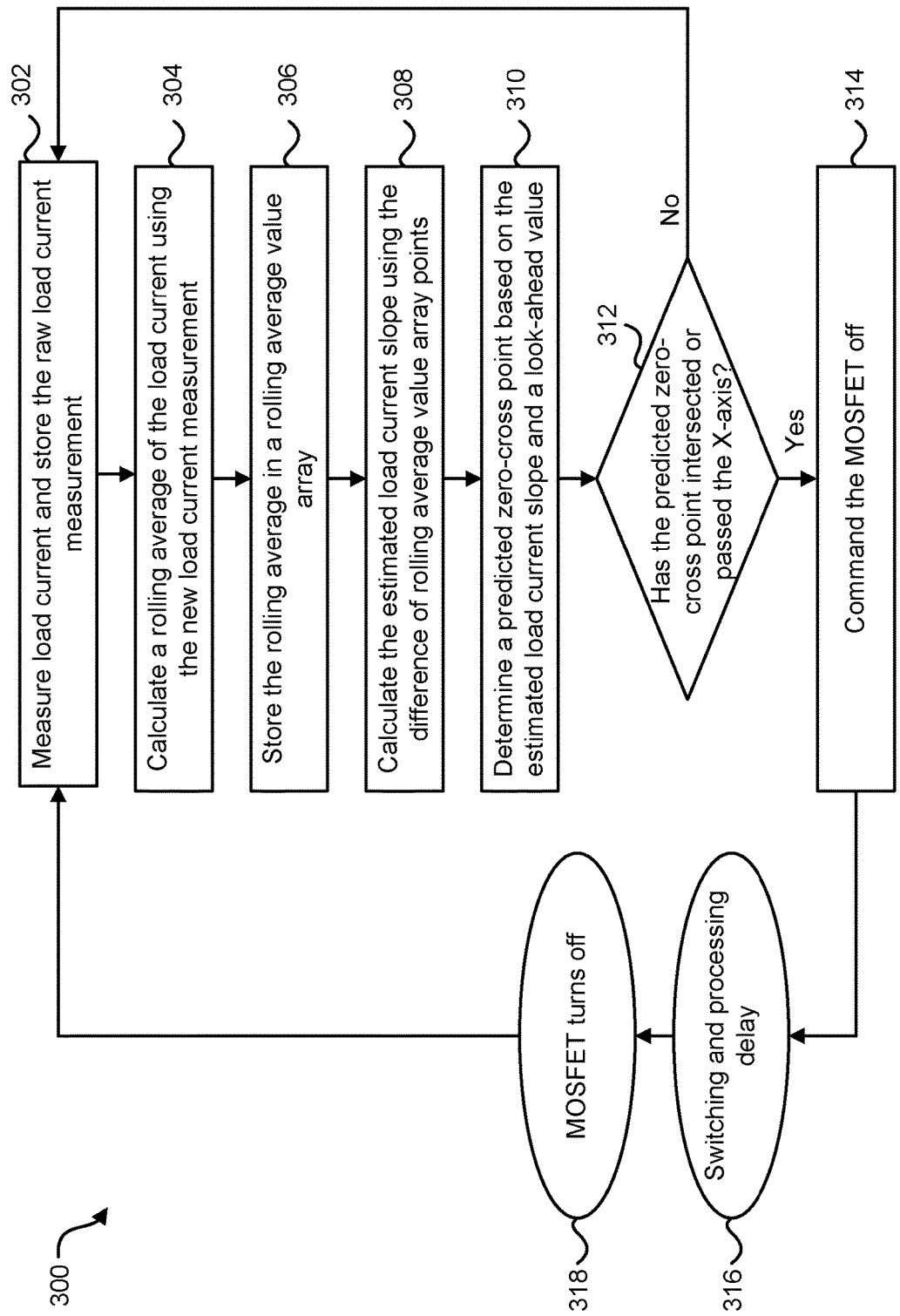
FIG. 3 is a flow diagram illustrating another configuration of a method for predictive lighting control using load current slew rate for power switching.

FIG. 3 is a flow diagram illustrating another configuration of a method 300 for predictive lighting control using load current slew rate for power switching. The method 300 may be performed by the electronic device 102 described in relation to FIG. 1.

The electronic device 102 may measure 302 load current and store the raw load current measurement 126. For example, the electronic device 102 may include current measuring circuitry 108. The current measuring circuitry 108 may measure 202 the load current (i.e., the current passed to the load 112) to produce a load current measurement 126.

The electronic device 102 may calculate 304 a rolling average of the load current using the new load current measurement 126. This may be accomplished according to Equation (1). In some implementations, the electronic device 102 may calculate the rolling average using at least ten sample points.

The electronic device 102 may store 306 the rolling average in a rolling average value array. The rolling average value array may include rolling averages for a number of sample points (e.g., at least ten sample points). An example of a rolling average value array is described in connection with FIG. 5.

The electronic device 102 may calculate 308 the estimated load current slope (also referred to as the slew rate) using the difference of rolling average value array points. For example, the electronic device 102 may determine the average load current difference between the rolling average for the current sample point and a rolling average for an earlier sample point. The electronic device 102 may then divide the average load current difference by a time interval between the current sample point and the earlier sample point. The estimated load current slope may be determined according to Equation (2).

The electronic device 102 may determine 310 a predicted zero-cross point based on the estimated load current slope and a look-ahead value. For example, the electronic device 102 may add the most recent rolling average load current measurement AvgAmps[n] to the load current slope multiplied by a look-ahead value. This may be accomplished according to Equation (3). In some implementations, the look-ahead value may be a time interval that is configured based on switching delays (e.g., signal propagation delays, sampling delays, processing delays, switching delays of MOSFETs 114, etc.).

The electronic device 102 may determine 312 whether the predicted zero-cross point has intersected or passed the X-axis. For example, the electronic device 102 may determine whether the predicted zero-cross point changes sign. This may be accomplished by comparing the sign of a previous calculation of the predicted zero-cross point. If the predicted zero-cross point has not intersected or passed the X-axis (e.g., the sign of the predicted zero-cross point has not changed), then the electronic device 102 may measure 302 another load current sample.

If the electronic device 102 determines 312 that the predicted zero-cross point has intersected or passed the X-axis (e.g., the sign of the predicted zero-cross point has changed), then the electronic device 102 may command 314 the MOSFET 114 off. For example, the electronic device 102 may generate a signal 118a that causes one or more of the MOSFETs 114 to turn off. After the switching and processing delay 316, the MOSFET 114 turns off 318. The electronic device 102 may then continue to measure 302 load current for the next half-cycle of the load current waveform.

Figure 4:
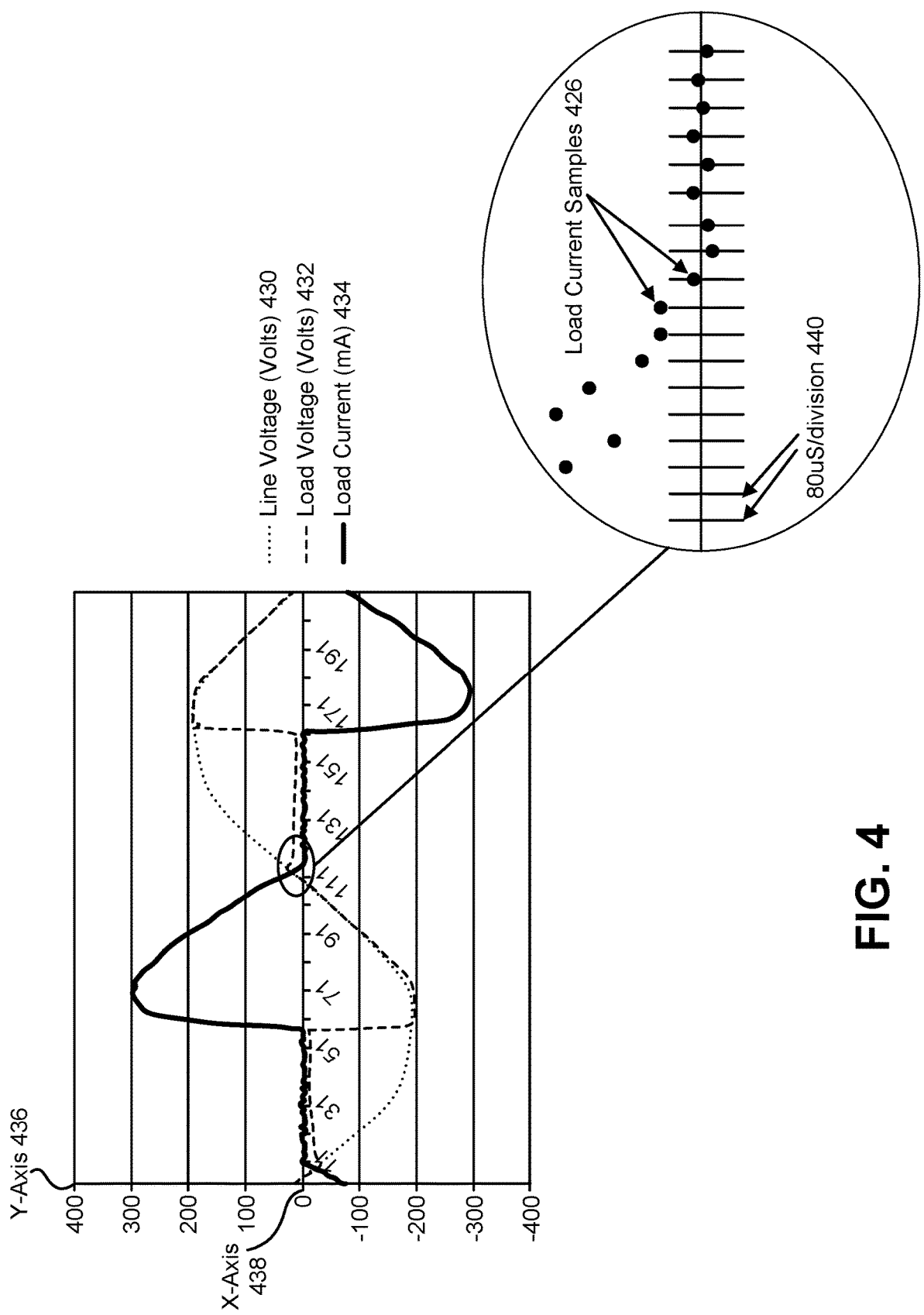
FIG. 4 illustrates examples of waveforms for a line voltage, a load voltage and a load current.

FIG. 4 illustrates examples of waveforms for a line voltage 430, a load voltage 432 and the load current 434. The line voltage 430, load voltage 432 and the load current 434 are shown with respect to a Y-axis 436 and an X-axis 438. FIG. 4 also illustrates the samples 426 of the load current 434 being used to predict the current zero-cross point (i.e., the location where the load current 434 is predicted to pass the X-axis 438). With respect to FIG. 4, the waveforms are illustrated with a sample rate 440 of 80 μs, but other sample rates may be used. Other possible sample rates may be 20 μs, 40 μs, 60 μs, etc.

Figure 5:
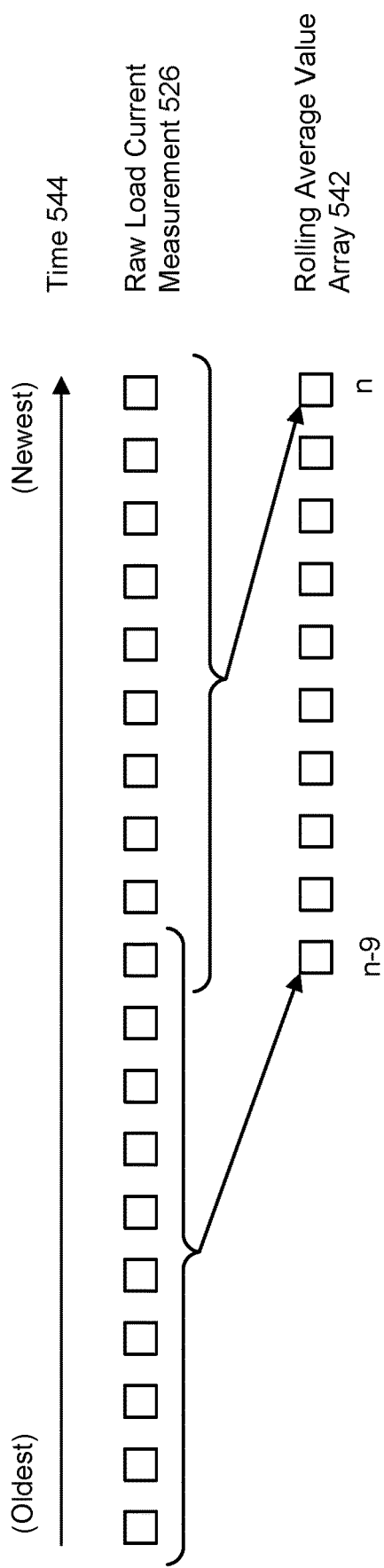
FIG. 5 illustrates a rolling average value array.

FIG. 5 illustrates a rolling average value array 542. Raw current load measurements 526 are shown in relation to time 544. In an implementation, ten raw current load measurements 526 are averaged to arrive at one of the elements (e.g., element n−9) in the array 542. When the next current load measurement 526 is sampled, the oldest raw current load measurement 526 may be subtracted and the newest raw current load measurement 526 may be added in and stored in the next array position.

Each position in the array 542 may be filled with the oldest being replaced by the newest. An index for the newest and the oldest values in the rolling average value array 542 may be maintained.

One possible formula for calculating a rolling average is shown in Equation (1). The system may store each averaged point in a rolling ten point array 542. In one configuration, n=10.

The slope of the load current may be determined by using the slope formula as shown in Equation (2). Furthermore, if the sampling rate is 20 μs, then the Time Interval=number of samples*20 μs. The difference used to determine the slope of the load current may be the value of the array 542 at n minus the value of the array 542 at n−9 (e.g., Newest value minus Oldest value).

The predicted zero-cross point may be determined using the formula as shown in Equation (3). The LookAheadValue may be the number of sample periods the system wants to predict the zero-cross in the future.

Figure 6:
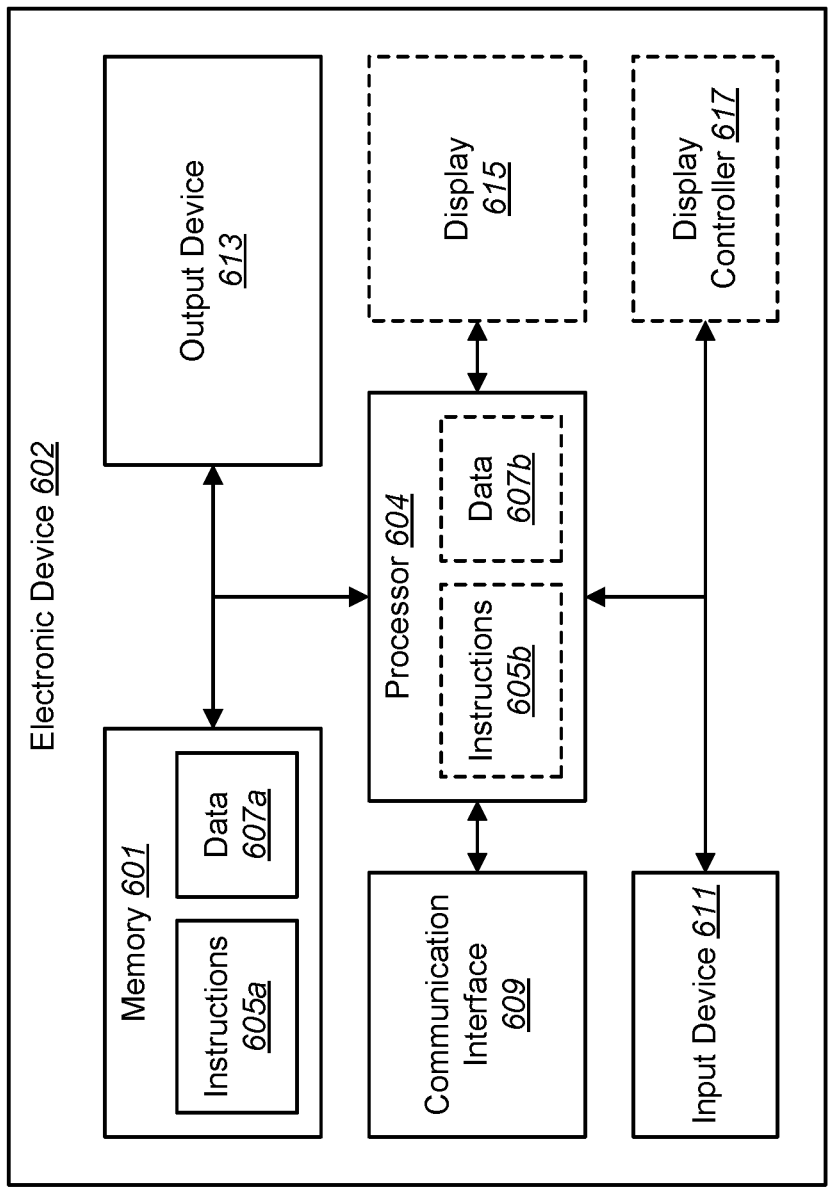
FIG. 6 illustrates various components that may be utilized in an electronic device.

FIG. 6 illustrates various components that may be utilized in an electronic device 602. The electronic device 602 described in connection with FIG. 6 may be configured in accordance with the electronic device 102 described herein. The electronic device 602 may include a memory 601, a communication interface 609, an input device 611, a processor 604, an output device 613, a display 615, and/or a display controller 617. The memory 601 may store instructions 605*a* and data 607*a*. The processor 604 may operate on instructions 605*b* and data 607*b*. It should be noted that the display 615 and/or display controller 617 may be optional. For example, some configurations of the electronic device 602 may not have a display. Additionally or alternatively, some configurations of the electronic device 602 may include a button interface (e.g., an input device 611). Some configurations of the electronic device 602 may be controlled on a remote display device (e.g., a touch panel) with communication through a remote device (e.g., a controller, home automation controller, etc.).

The term "discrete circuit" refers to an electronic circuit built out of discrete components. Examples of discrete components include resistors, capacitors, inductors, transformers, transistors, etc. In some configurations, a discrete circuit may not be a solid state integrated circuit that performs all of the functions described herein. However, a discrete circuit may include one or more discrete components contained in the same packaging (e.g., bridge rectifier, solid state relay, etc.). In some configurations, a discrete circuit made from discrete components refers to a circuit having separate components or circuits that perform individual finite functions. For instance, examples of a discrete circuit may include load voltage measuring circuitry, switching circuitry, a processor, line voltage measuring circuitry, and/or current measuring circuitry that may perform separate and discrete functions while being implemented within an electronic device. An electronic device may be housed within a wall box. Moreover, each module within an electronic device may include discrete components or discrete circuits. In some instances, the term "circuit" may refer to a circuit in its entirety, for example, including the impedance of the wall box device and the impedance of the load.

The term "processor" should be interpreted broadly to encompass a general purpose processor, a central processing unit (CPU), a microprocessor, a digital signal processor (DSP), a controller, a microcontroller, a state machine, and so forth. Under some circumstances, a "processor" may refer to an application specific integrated circuit (ASIC), a programmable logic device (PLD), a field programmable gate array (FPGA), etc. The term "processor" may refer to a combination of processing devices, e.g., a combination of a DSP and a microprocessor, a plurality of microprocessors, one or more microprocessors in conjunction with a DSP core, or any other such configuration.

The term "memory" should be interpreted broadly to encompass any electronic component capable of storing electronic information. The term memory may refer to various types of processor-readable media such as random access memory (RAM), read-only memory (ROM), non-volatile random access memory (NVRAM), programmable read-only memory (PROM), erasable programmable read-only memory (EPROM), electrically erasable PROM (EEPROM), flash memory, magnetic or optical data storage, registers, etc. Memory is said to be in electronic communication with a processor if the processor can read information from and/or write information to the memory. Memory that is integral to a processor is in electronic communication with the processor.

The terms "instructions" and "code" should be interpreted broadly to include any type of computer-readable statement(s). For example, the terms "instructions" and "code" may refer to one or more programs, routines, subroutines, functions, procedures, etc. "Instructions" and "code" may comprise a single computer-readable statement or many computer-readable statements.

The term "computer-readable medium" refers to any available medium that can be accessed by a computer or processor. A computer-readable medium may be non-transitory and tangible. By way of example, and not limitation, a computer-readable medium may comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk, and Blu-ray® disc where disks usually reproduce data magnetically, while discs reproduce data optically with lasers.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

It is to be understood that the claims are not limited to the precise configuration and components illustrated above. Various modifications, changes, and variations may be made in the arrangement, operation, and details of the systems, methods, and apparatus described herein without departing from the scope of the claims.

What is claimed is:

1. An electronic device, comprising:
   current measuring circuitry configured to measure load current to produce a load current measurement; and
   a processor coupled to the current measuring circuitry, wherein the processor is configured to calculate an estimated load current slope based on the load current measurement and to determine a predicted zero-cross point for the load current based on the estimated load current slope to minimize damaging voltage spike creation, and wherein the processor calculates a rolling average of the load current for a current sample point.

2. The electronic device of claim 1, wherein the processor calculates the rolling average using at least ten sample points.

3. The electronic device of claim 1, wherein the processor stores the rolling average in an average value array.

4. The electronic device of claim 3, wherein the average value array comprises rolling averages for a number of sample points.

5. The electronic device of claim 1, wherein the processor configured to calculate the estimated load current slope comprises the processor configured to:
   determine an average load current difference between the rolling average for the current sample point and a rolling average for an earlier sample point; and
   divide the average load current difference by a time interval between the current sample point and the earlier sample point.

6. The electronic device of claim 1, wherein the processor configured to determine the predicted zero-cross point comprises the processor configured to:
   add the rolling average of the load current for the current sample point to the estimated load current slope multiplied by a look-ahead value.

7. The electronic device of claim 6, wherein the look-ahead value comprises a time interval to compensate for switching delays.

8. The electronic device of claim 1, wherein the processor is further configured to determine that the predicted zero-cross point crosses an X-axis when the predicted zero-cross point changes sign.

9. The electronic device of claim 1, wherein the processor causes at least one switch to be turned off at the predicted zero-cross point.

10. The electronic device of claim 9, wherein the processor causes the at least one switch to be turned off when the predicted zero-cross point changes sign.

11. The electronic device of claim 9, wherein the at least one switch comprises a first metal-oxide-semiconductor field-effect transistor (MOSFET).

12. A method, comprising:
    measuring load current to produce a load current measurement;
    calculating a rolling average of the load current for a current sample point;
    calculating an estimated load current slope based on the load current measurement; and
    determining a predicted zero-cross point for the load current based on the estimated load current slope to minimize damaging voltage spike creation.

13. The method of claim 12, wherein calculating the estimated load current slope comprises:
    determining an average load current difference between the rolling average for the current sample point and a rolling average for an earlier sample point; and
    dividing the average load current difference by a time interval between the current sample point and the earlier sample point.

14. The method of claim 12, wherein determining the predicted zero-cross point comprises:
    adding the rolling average of the load current for the current sample point to the estimated load current slope multiplied by a look-ahead value.

15. The method of claim 12, further comprising causing at least one switch to be turned off at the predicted zero-cross point.

16. The method of claim 15, wherein the at least one switch is caused to be turned off when the predicted zero-cross point changes sign.

17. The method of claim 15, wherein the at least one switch comprises a first metal-oxide-semiconductor field-effect transistor (MOSFET).

18. A non-transitory computer-readable medium, the computer-readable medium comprising executable instructions for:
    measuring load current to produce a load current measurement;
    calculating a rolling average of the load current for a current sample point;
    calculating an estimated load current slope based on the load current measurement; and
    determining a predicted zero-cross point for the load current based on the estimated load current slope to minimize damaging voltage spike creation.

* * * * *